United States Patent

Lee et al.

[11] Patent Number: 6,165,807
[45] Date of Patent: Dec. 26, 2000

[54] METHOD FOR FORMING JUNCTION LEAKAGE MONITOR FOR MOSFETS WITH SILICIDE CONTACTS

[75] Inventors: Kun-Yue Lee; Chung-Min Liu, both of Char-Ye, Taiwan

[73] Assignee: Taiwan Smiconductor Manufacturing Company, Hsin-Chu, Taiwan

[21] Appl. No.: 09/236,494

[22] Filed: Jan. 25, 1999

[51] Int. Cl.$^7$ .................................................. H01L 21/66
[52] U.S. Cl. .............................................. 438/18; 438/14
[58] Field of Search ..................... 438/18, 5–13, 438/14–17, 100, 101, 400, 401, 466, 469, 800

[56] References Cited

U.S. PATENT DOCUMENTS

| | | | |
|---|---|---|---|
| 4,100,486 | 7/1978 | Casowitz et al. | 324/62 |
| 4,305,760 | 12/1981 | Trudel | 148/1.5 |
| 4,592,921 | 6/1986 | Hieber et al. | 427/9 |
| 5,451,529 | 9/1995 | Hsu et al. | 437/8 |
| 5,637,186 | 6/1997 | Liu et al. | 438/14 |
| 5,759,871 | 6/1998 | Hause et al. | 438/18 |

*Primary Examiner*—Charles Bowers
*Assistant Examiner*—Craig Thompson
*Attorney, Agent, or Firm*—George O. Saile; Stephen B. Ackerman

[57] ABSTRACT

A method for forming and using silicide test structures to monitor and evaluate the quality of a semiconductive junction after the formation of a silicide layer over the junction is described. Two specially designed test structures are formed for in-line testing in the kerf of an integrated circuit wafer. The test structures comprise a silicide region formed over a diffusion region which is formed concurrently with diffusion and silicide regions which form contacts of the integrated circuit dice. The test structures are fitted with probe pads connected to semiconductive element of the junction region. A first structure is designed to measure bulk junction leakages, has the silicide contact layer spaced away from the junction edge. A second structure, designed to measure edge related junction leakage phenomena, has a serpentine edge to which the silicide layer extends and a plurality of interior openings which serve as EMMI windows. After the silicide contact layers have been formed, and the excess refractory metal has been etch away, the structures are subjected to junction leakage measurement. Differences in junction leakage between the two structures indicate the leakage mechanisms as well as their bulk or edge relationship. Further testing by EMMI is used to confirm and supplement the leakage measurements.

7 Claims, 5 Drawing Sheets

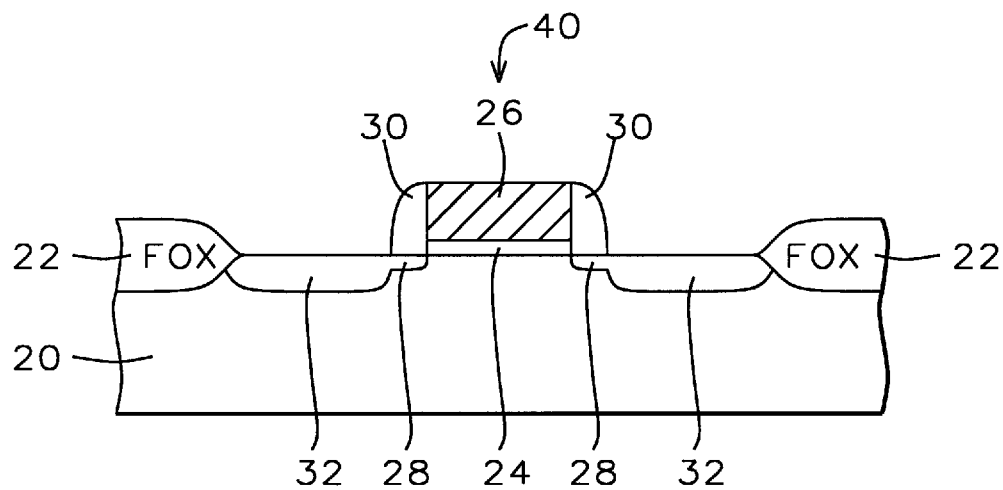
FIG. 1 - Prior Art
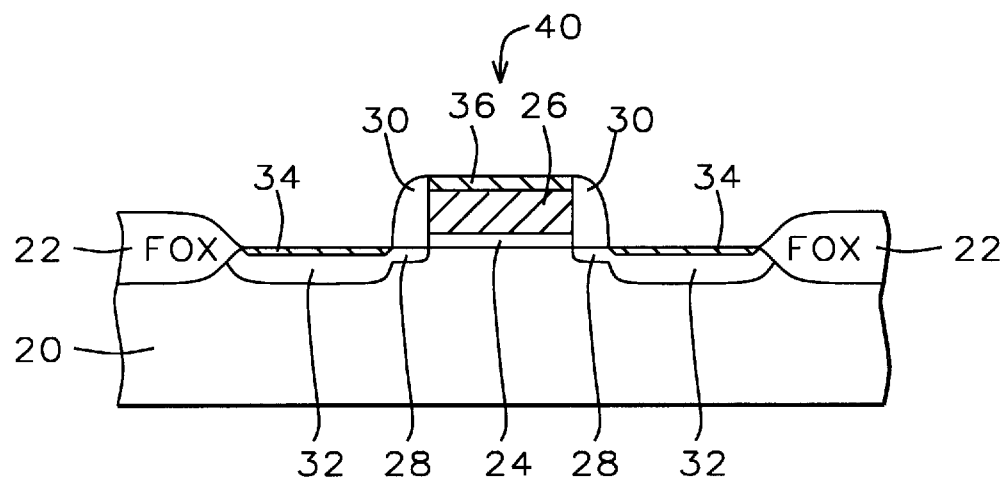
FIG. 2 - Prior Art

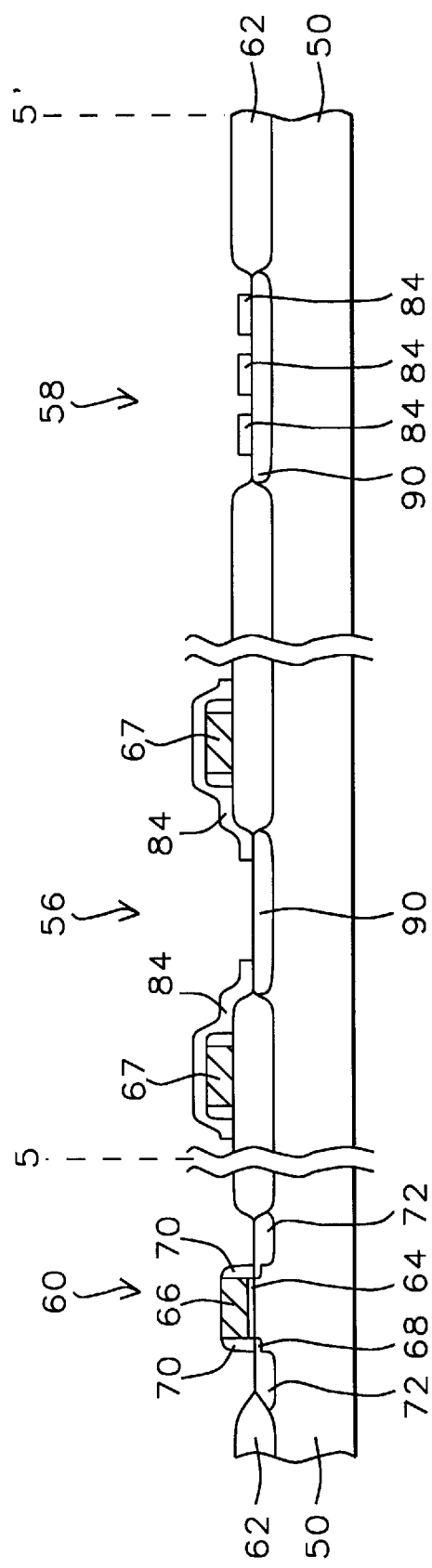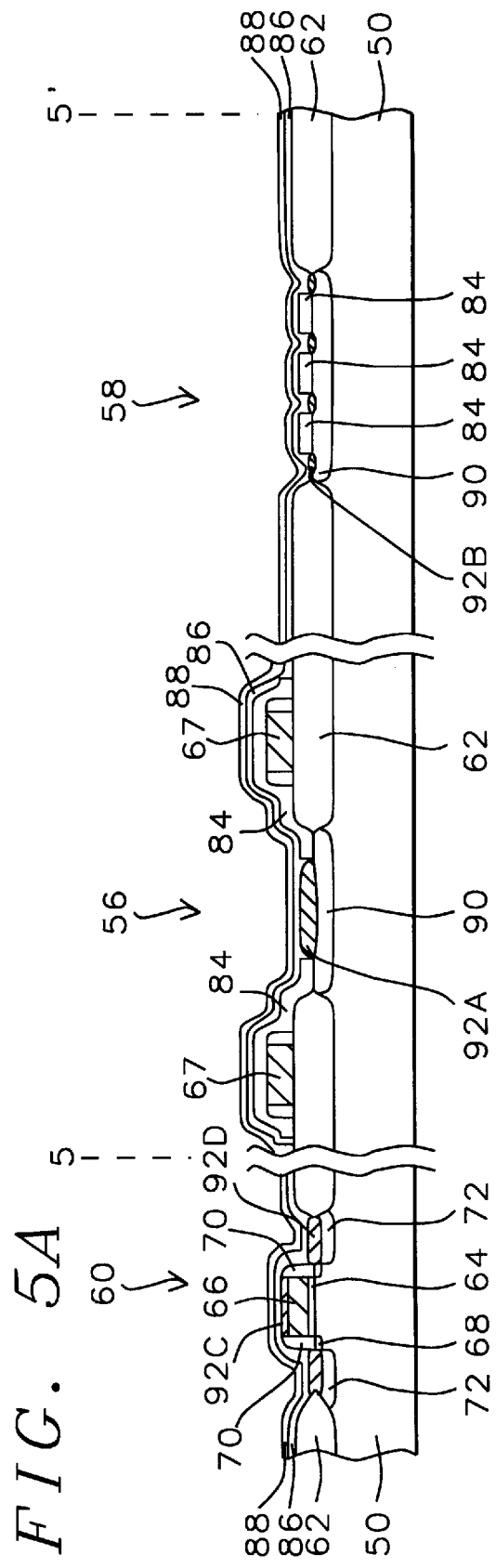

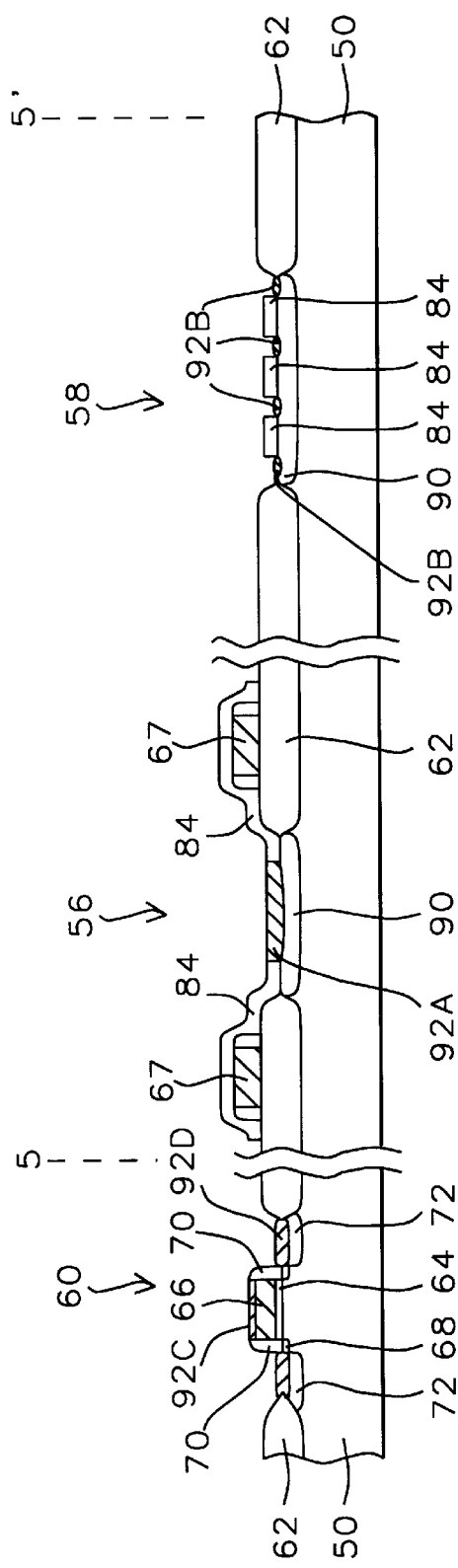
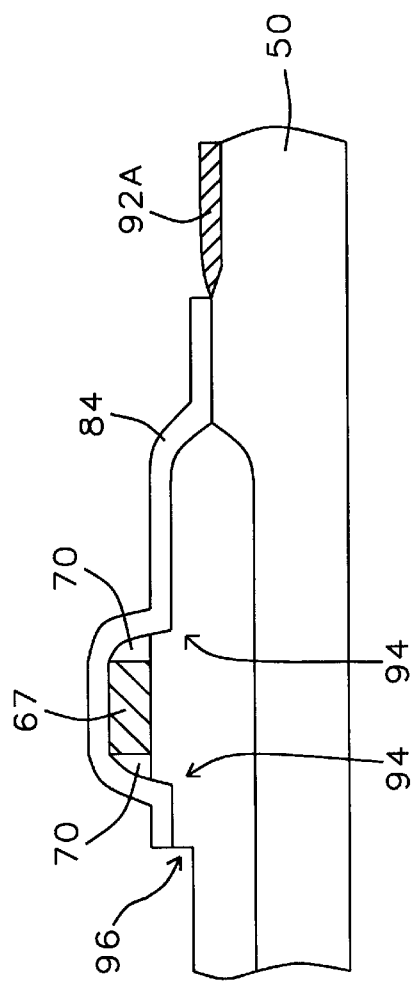
FIG. 5C
FIG. 6

METHOD FOR FORMING JUNCTION LEAKAGE MONITOR FOR MOSFETS WITH SILICIDE CONTACTS

BACKGROUND OF THE INVENTION

1. Field of the Invention

The invention relates to processes for the manufacture of semiconductor devices and more particularly to in-process testing of self-aligned silicide contacts on polysilicon gate field effect transistors.

2. Background of the Invention and Description of Prior Art

Complimentary metal oxide semiconductor(CMOS) field effect transistor(FET) technology involves the formation and utilization of n-channel FETs(n-MOSFET) and p-channel FETs(p-MOSFET) in combination to form low current, high performance integrated circuits. The complimentary use of n-MOSFETs and p-MOSFETs, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

FIG. 1 shows a cross section of a typical sub-micron n-MOSFET 40 on the surface of a silicon substrate 20. The silicon substrate 20 is p-type in the region where the n-MOSFET 40 is formed. This silicon wafer itself may be p-type or may have a discrete p-type region called a well. A p-MOSFET is formed in a corresponding n-type substrate region or n-type well. A field oxide isolation(FOX) 22 is formed by the local oxidation of silicon(LOCOS) patterning an island of active silicon whereon the n-MOSFET is then formed. A thin gate oxide 24 is grown by thermal oxidation and a polysilicon layer is deposited and patterned by well known photolithographic procedures to form the gate electrode 26 of the MOSFET.

An n-type dopant, for example, phosphorous or arsenic, is then ion implanted into the exposed silicon surface forming a lightly doped drain (LDD) region 28. The implanted region is self-aligned to the gate electrode 26. Next sidewall structures 30 are formed by a well known technique comprising a low pressure chemical vapor deposition (LPCVD) of an insulative material such as silicon oxide followed by reactive ion etching (RIE). A second implant, heavier than the first, of the same dopant material then forms the source/drain elements 32 of the n-MOSFET.

Referring now to FIG. 2, a layer of refractory metal, usually titanium is blanket deposited over the wafer. A thermal treatment, for example by rapid thermal processing (RTP), causes the portions of the titanium in contact with silicon to react and form titanium silicide ($TiSi_2$). Portions of the titanium layer over oxide such as the field isolation 22 and the sidewall spacers 30 do not react, providing the temperature of the RTP is sufficiently low, for example around 650° C. Subsequent chemical dissolution of the un-reacted titanium, for example in an aqueous etchant containing $H_2O_2$ and $NH_4OH$, leaves $TiSi_2$ 34 over the source/drain regions 32 and also 36 over the polysilicon gate electrode 26.

When the dimensions of the devices shrink into the sub half-micron range, problems begin to appear in this conventional process. In particular, as the devices become smaller, the source/drain regions 32 become shallower and silicide induced damage to the subjacent junctions, such as silicide spiking and junction leakage is likely to occur. In addition, the sidewall spacers 30 also shrink with device miniaturization and silicide bridging of occurs between the source/drain regions and the polysilicon gate electrode.

These various silicide related failure modes are primarily related to parametric abnormalities rather than defects. It is therefore beneficial to be able to detect and identify the causes of these various failure mechanisms in a timely fashion by the use of in-process testing procedures. Thereby defective wafers and/or jobs may be detected at an opportune time and remedial action may be taken with minimal product loss. Because electrical measurements on in-process integrated circuit product structures cannot be made, appropriately designed test structures are needed to further pinpoint the cause of the aberration.

Test structures for in process testing are generally formed either on test wafers or in unused regions of product wafers. The most cost effective placement of test structures in the saw kerf region of product wafers although this is not always possible. Hieber, et.al. U.S. Pat. No. 4,592,921 determine the electrical resistance of metal films during sputter deposition by performing in-situ measurements on a separate reference substrate which is moved alternately with production substrates under the sputtering targets.

Casowitz, et.al., U.S. Pat. No. 4,100,486 cites a test structure for in process measurement of mask defects or random particulate defects which bring about imperfections in diffused regions. The test structure comprising a serpentine stripe is patterned in an oxide layer overlying a silicon surface. After subjecting the exposed silicon to a diffusion process, a layer of platinum is deposited on the wafer. The layer is thermally annealed to form platinum silicide where it contacts the silicon on the serpentine stripe. Excess platinum is then removed by aqueous etching. The platinum silicide lowers the resistance of the stripe enabling resistance measurements by probing the stripe. Opens and shorts in the stripe caused by the presence of defects are located by means of probe testing at various locations on the stripe.

Hsu, et.al., U.S. Pat. No. 5,451,529 uses an insulated metal silicide layer to determine ion implantation dosage by measuring the change in sheet resistance of the test layer caused by implantation damage. Liu, et.al., U.S. Pat. No. 5,637,186 cite test structures and methods for measuring critical dimensions of integrated circuit patterns. Trudell, U.S. Pat. No. 4,305,760 cites a method for avoiding exposure of contact regions of the silicon substrate to a polysilicon etch, thereby reducing junction leakage current by eliminating the damage normally caused by this etch.

SUMMARY OF THE INVENTION

It is an object of this invention to provide a method for testing and designs of test structures for detecting semiconductor junction abnormalities caused by silicide contact processing.

It is another object of this invention to provide a method for testing and designs of test structures which differentiates abnormal junction characteristics and other device faults associated with silicide edges and those associated with the bulk.

It is another object of this invention to provide a method for testing and designs of test structures which can differentiate suicide induced device degradation between silicide spiking and Ti traps.

These objects are accomplished by the use of two specially designed test structures which are formed in the kerf regions of an integrated circuit wafer. The test structures comprise a silicide region formed over a diffusion region and are formed concurrent with the formation of diffusion and silicide regions on integrated circuit dice. Measurements of the tests structures permit the detection and identification of various failure mechanisms in a timely fashion by the use of in-line testing procedures. Thereby defective wafers and/or jobs may be detected at an opportune time and remedial action may be taken with minimal product loss. Both sides of the pin junctions of the test structures are connected to remote probe pads for testing. The probe pad connections are made to the silicide region and to the substrate or well.

A first structure, hereinafter referred to as the area device, is rectangular in shape is designed to measure bulk or junction edge independent leakages. The second structure, hereinafter referred to as the edge device has a serpentine edge, whereby the junction edge is defined by field oxide. The serpentine edge permits the device to have a relatively high junction edge-to-surface area ratio. The edge-to-surface area ratio is defined as the ratio of the total length of edge divided by the surface area in comparable units, for example edge length(microns)/surface area(microns$^2$). A number of structure pairs are distributed over the wafer to provide a sufficient sample size for measurements.

After the silicide contact layers have been formed, and the excess refractory metal has been etch away. the structures are measured for resistivity and for junction leakage. Measurement of junction leakage is performed by applying probes to probe pads connected to the silicide layer of the structure and to the substrate or well material. Current-voltage(I-V) measurements are made using conventional probe measuring procedures. Leakage current through the reverse biased junction is recorded and compared with process specifications. Emission microscope multilevel inspection (EMMI) measurements are performed on the edge device are used to confirm edge leakage measurements and to further identify leakage mechanisms. EMMI observations are made at the edges of the silicide region and in inspection windows patterned within the silicide region. Ti traps are identified as hot spots observed along the edges. On the contrary, the appearance of random hot spots indicates the occurrence of spiking. The concentration of Ti traps is determined an activation energy measurement.

BRIEF DESCRIPTION OF THE DRAWINGS

FIG. 1 and FIG. 2 are cross sections illustrating process steps for the formation of silicide conductive layers over source/drain regions and on a polysilicon gate electrode of an n-channel MOSFET by a prior art process.

FIG. 5A through FIG. 5C are cross sections of a wafer showing process steps for the implementation of an embodiment of the current invention.

FIG. 6 is a cross section of a portion of the test structure shown in FIG. 4A illustrating field oxide losses resulting from over etching of gate sidewalls and from patterning a resist protection oxide layer.

DESCRIPTION OF THE PREFERRED EMBODIMENTS

Figure 3:
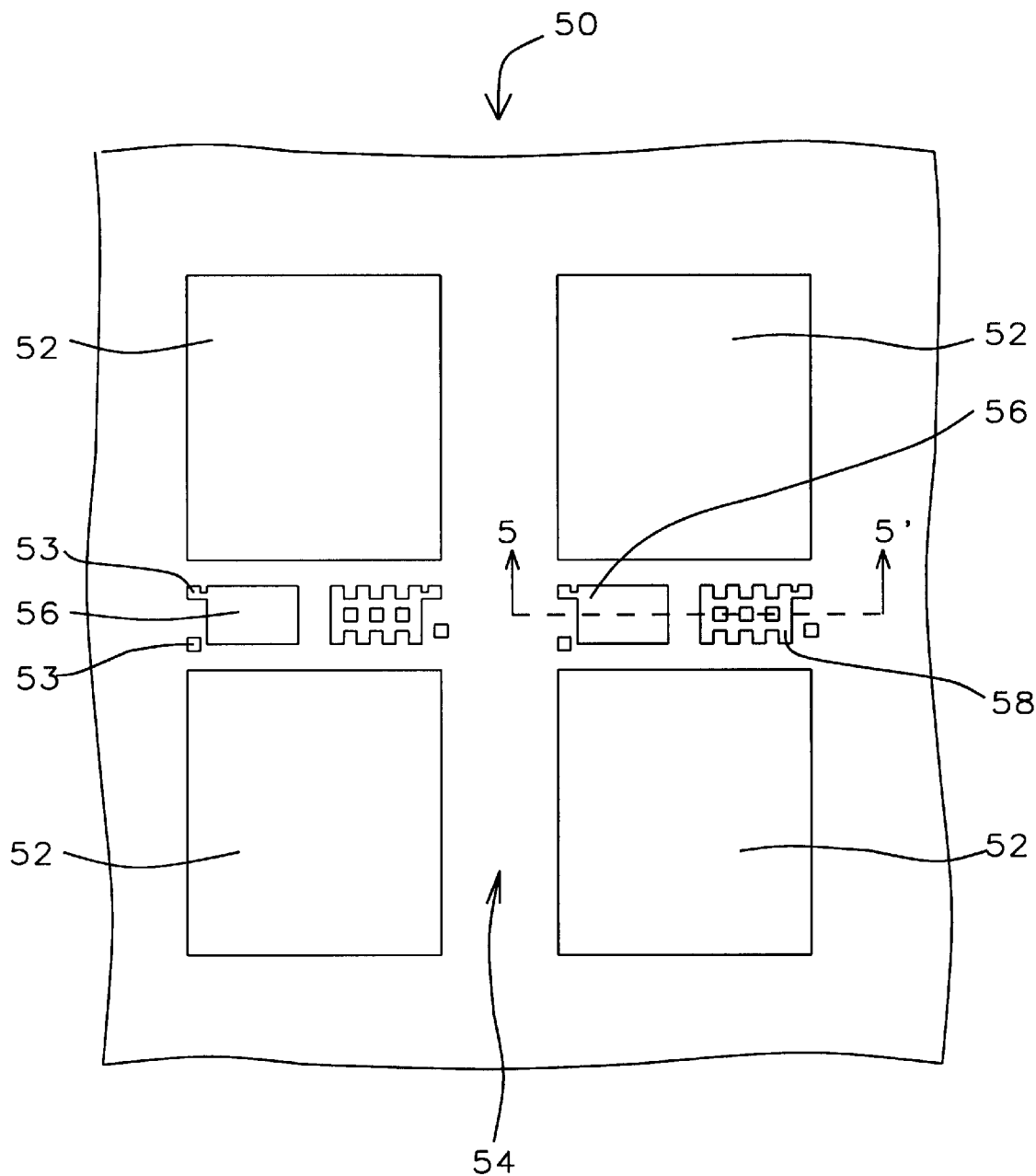
FIG. 3 is a plan view of a wafer showing the wafer location of integrated circuit dies and silicide test structures according to an embodiment of the current invention.

In a preferred embodiment of this invention a p-type monocrystalline wafer 50 is provided. FIG. 3 is a plan view of the a portion of the layout of features to be formed on the wafer 50. A plurality of integrated circuit dice 52 are to be formed on the wafer using conventional and well known semiconductor processing techniques. The dice are arranged in a rectangular array over the wafer 50 separated by a saw kerf region 54 where the completed dice will be cut apart after the processing is complete. During processing, however, the saw kerf region 54 provides ample area for the placement of test structures which permit in-process monitoring and control. Such process monitoring also enables timely and cost effective scrapping of defective product.

In the embodiment, two test structures 56, 58 are to be formed in the wafer kerf area 54 which are to be tested after the formation of a silicide layer on silicon and polysilicon surfaces of the integrated circuit dice 52. Probe pads 53 are connected to the silicide layer and to the substrate or well portion of each structure so that a test voltage may be applied across the p/n junction of each device. These structures are shown in greater detail in FIG. 4A and 4B. The structures are tested after a silicide layer is formed over the silicon active areas.

Figure 4A:
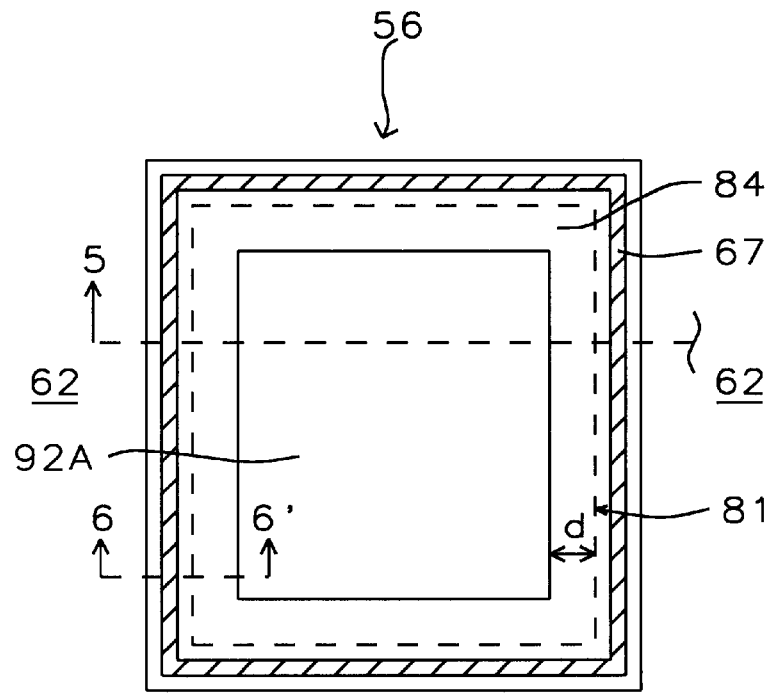
FIG. 4A is a silicide test structure designed to detect and measure junction leakages caused by area related defects according to an embodiment of the current invention.

The first structure 56, shown in plan view in FIG. 4A, is a silicide test structure having a relatively small edge-to-surface are ratio and will be referred to as the area device. The structure 56 comprises a rectangular silicon region surrounded by field oxide 62 and covered with a refractory metal silicide pad 92A. The refractory metal used in the embodiments of this invention is titanium although other refractory metals, for example tungsten, tantalum, cobalt, or molybdenum could also be employed. The silicon region is electrically isolated by the field oxide and by a subjacent p/n junction and is representative of the source/drain element of a MOSFET. The silicide 92A is about 100 by 100 microns in the planar dimension. The dotted line 81 represents the edge of a field oxide 62. A polysilicon gate stack band 85 including LDD sidewalls (not shown in FIG. 4A) is formed over field oxide 62. The polysilicon gate stack band closely replicates the configuration typically found in the product circuits wherein polysilicon lines travel over field oxide adjacent to MOSFET source/drain regions. Placed on the field oxide of the test structure 56, the polysilicon gate stack band serves to identify the source of leakage detected by measurements on the test structure.

An oxide layer 84, deposited and patterned prior to refractory metal deposition and defines the edges of a silicide region 92A. The oxide layer 84 is conventional in some integrated circuit processes and is referred to as an RPO (resist protection oxide) layer. By defining the silicide region at a distance "d" within the field oxide region, the silicide edge is spaced away from the p/n junction edge which lies at the edge of the field oxide 81. The spacing "d" is preferably about 2 microns. Thus the area device is designed to be independent of the junction edge and thereby is geared to measure bulk leakage. The oxide layer 84 extends from the edge of the silicide pad 92A, over the gate stack band 85 to the edge of the test structure.

Figure 4B:
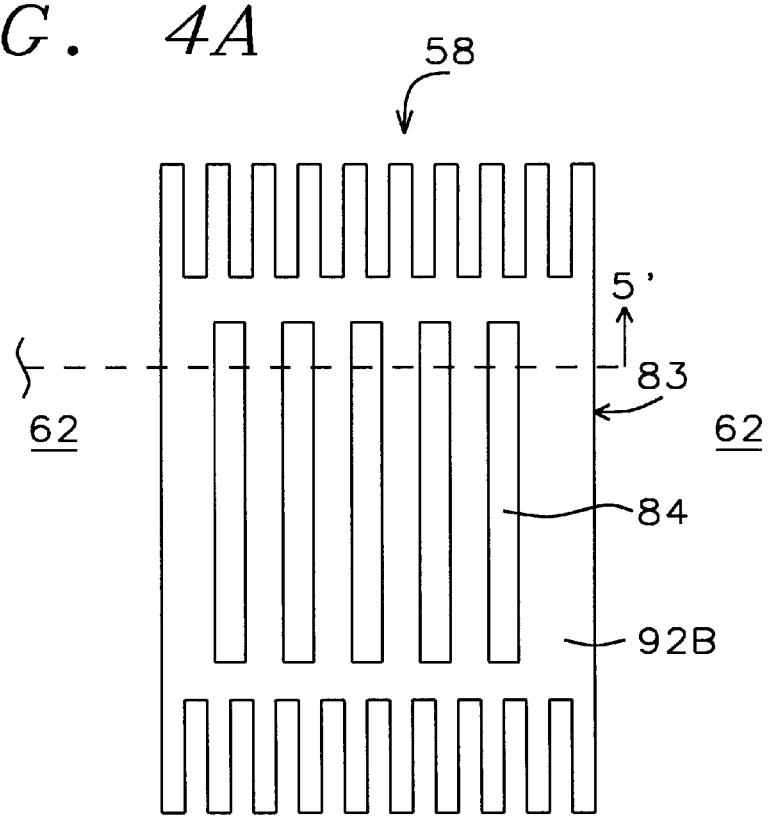
FIG. 4B is a silicide test structure designed to measure junction edge related leakages according to an embodiment of the current invention.

The edge device 58 shown in plan view in FIG. 4B, is a silicide test structure having a relatively high edge effect sensitivity. The structure 58 comprises a silicon region surrounded by field oxide and having a serpentine edge on two opposing sides and internal openings. The silicon region is covered with a refractory metal silicide 92B. The silicon region is electrically isolated by the field oxide and by a subjacent p/n junction and is representative of the source/drain element of a MOSFET. The peripheral edge 83 of the silicide pad 92B is defined by field oxide 62 and the internal openings are defined by islands of the oxide layer 84. The pad 92B is about 100 by 100 microns in overall dimension, but preferably designed so that it's area is the same as the edge device but because of the serpentine edge pattern it's length of edge is substantially greater.

The dimensions of the serpentine pattern and the internal openings are chosen so that the area of the edge device 58 is approximately identical to the area of the area device 56. The preferred silicide surface area in the test structures 56,58 is between about 2,500 and 10,000 square microns. The serpentine edges, which define the field oxide region and thereby the junction edge of the edge device, permit the device 58 to have a high sensitivity to edge effects. The detailed configuration of the test structures 56,58 below the metal silicide pads will become clear as their formation is hereinafter described with the aid of cross sectional illustrations.

Referring next to FIG. 5A, there is shown a cross section of the wafer 50 along the line 5–5' in FIG. 3. Alongside the cross section 5–5' is a corresponding cross section of an n-MOSFET 60 being processed in one of the integrated circuit dice 52. The n-MOSFET 60 is shown as a reference in FIGS. 5A through 5C so that the processing of the MOSFETs in the integrated circuits may be observed as the formation of the test structures is described. The cross sections displayed in FIGS. 5A through 5C also represent the planar views of the test structures 56 and 58 shown in FIGS. 4A and 4B except that only three oxide islands 84 of the edge device 58 are shown in the cross sections.

A field oxide isolation 62 is formed on the wafer 50 using the well known LOCOS procedure. An opening for an n-channel MOSFET 60 is formed in at least one of the integrated circuit dice 52. Field oxide openings are also formed in the kerf region for an area device 56 and an edge device 58. The field oxide openings are consistent with the planar views of these structures shown in FIGS. 4A and 4B.

Next, using conventional and well known procedures for forming MOSFETs, a gate oxide 64 is formed and a polysilicon gate electrode 66 is patterned over it. An n-type LDD ion implant 68, for example phosphorous, is next performed followed by the formation of sidewall structures 70. The polysilicon gate stack band 67 is concurrently formed on the area device 56. Next source/drain regions 72 are ion implanted with an n-type dopant, for example phosphorous, according to well known methods and to the specifications of the integrated circuits. The test structures 56,58 in the kerf receive both the LDD and the source/drain ion implantations and thereby n-type active areas 90 are formed in these regions and p/n junctions are formed between the n-type active areas 90 and the p-type substrate material 50.

A layer of silicon oxide 84 is deposited over the wafer 50. The silicon oxide layer is deposited by CVD (chemical vapor deposition) to a thickness of between about 200 and 1,000 Angstroms. Procedures for depositing silicon oxide layers by CVD methods are well known and widely practiced in the art. The silicon oxide layer 84 is patterned by conventional photolithographic techniques to define the edges of the area device 56 and the interior islands 84 of the edge device 58.

Referring next to FIG. 5B, a titanium layer 86 having a thickness of 300 Angstroms or thereabout is deposited over the wafer by sputtering. Immediately thereafter and without breaking vacuum a titanium nitride layer 88 having a thickness of 250 Angstroms or thereabout is sputtered on the titanium layer 86. This may be accomplished by sputtering of a titanium target, first with argon to form the titanium layer 86 and then with nitrogen to form the titanium nitride layer 88. Alternately interchangeable targets of titanium and of titanium nitride may be used in the same chamber. The TiN layer 88 serves to protect the Ti layer 86 from oxidation upon exposure to atmosphere.

A rapid thermal anneal(RTA) is then performed at a temperature of 700° C. or thereabout for a period of 30 seconds or thereabout. The annealing causes the Ti to react with the underlying silicon forming titanium silicide($TiSi_2$). $TiSi_2$ regions are formed over the source/drain regions 72 (92D) of the N-MOSFET, the exposed surface of the gate electrode 66 (92C), and the exposed silicon surfaces of the test structures 56(92A), and 58(92B). The wafer is next subjected to an aqueous etching procedure wherein the TiN 88 and remaining unreacted titanium 86 are selectively removed, leaving the $TiSi_2$ coatings. The resultant cross section is shown in FIG. 5C.

The silicide test structures 56,58, shown in cross section in FIG. 5C are now complete and may be tested to ascertain the quality of the subjacent p/n junctions. The wafer is placed on the table of a conventional electrical probe tester whereupon the p/n junctions are tested for leakage by the application of reverse bias test voltage to the probe pads 53 (FIG. 3). The current-voltage (I-V) characteristic of the junctions is also determined by well known testing procedures. Excessive leakage of the area device only indicates a bulk leakage phenomena. If bulk leakage is confirmed, activation energy measurements are performed to differentiate between Ti traps and spiking. Excessive leakage of the edge device only suggests an edge related mechanism which could also be attributed to Ti traps.

Excessive leakage in both area and edge structures requires further testing by EMMI. If both structures exhibit equal excessive leakage, silicide spiking is the likely cause. If both structures exhibit excessive leakage and the leakage of the edge device is greater than that of the area device, both spiking and Ti Traps are present.

In addition to the electrical testing procedures the test structures 56, 58 should be examined by EMMI to further identify the various leakage mechanisms. EMMI measurements are performed on the edge device to confirm edge leakage measurements and to further identify the leakage mechanism. The silicide layer on the test structures obstructs the emission of light from sources beneath it. However, the oxide layer 44 of the area device 56 lies over the junction edge and thus forms a window through which edge related hot spots may be observed. The oxide islands 84 on the edge device 58 similarly provide observation windows through which EMMI observation may be made of leakage occurrences beneath the bulk of the junction. Ti traps are identified as hot spots observed along the edges. In contrast, the appearance of random hot spots indicates spiking. The concentration of Ti traps may also be determined an activation energy measurement.

Edge leakage can be introduced by excessive over etching of the field oxide 62 during the formation of the sidewalls 70 or during the patterning of the RPO layer 84. FIG. 6 shows a cross section of the portion of the area test device 56 on the wafer 50 identified in FIG. 4A by the line 6–6'. The Loss of field oxide 62 during the formation of the sidewall 70 is identified by observation of a jog 94 in the field oxide 62. Similarly, over etching of the RPO layer 84 causes field oxide loss represented by the jog 96. Examination of the cross section of the polysilicon gate stack structure on the area device 4A by SEM (scanning electron microscopy) can readily determine if either of these process aberrations are present.

After testing appropriate remedial measures to the process are taken if so indicated. Such remedial measures would include, examination of the immediate processing steps for example, ascertaining if the temperature of the annealing step is too high. Other prior processing steps would then be evaluated as for aberrations, for example, the dosage and energy of the source/drain implant.

While the embodiments of this invention utilize a p-type silicon substrate, an n-type silicon substrate could also be used without departing from the concepts therein provided. Similarly the silicide test structures could be formed with a p-type ion implant on an n-type substrate. It should be further understood that the substrate conductivity type as referred to herein does not necessarily refer only to the conductivity of the starting wafer but could also be the conductivity of a diffused region or well within a wafer wherein the semiconductor devices are incorporated. Although FIG. 3 illustrates only one test device pair, it is to be understood that a plurality of such test device pairs are to be included on the wafer. In addition the incorporation of comparable pairs of test structures formed in both n- and p-type regions or wells is also to be understood.

The embodiments use of titanium silicide in the formation of the test structures. It is to be understood that other refractory metal silicides, for example tungsten silicide or cobalt silicide could be used as well without departing from the spirit and scope of the invention.

While this invention has been particularly shown and described with reference to the preferred embodiments thereof, it will be understood by those skilled in the art that various changes in form and details may be made without departing from the spirit and scope of the invention.

What is claimed is:

1. A method for forming and measuring silicide test devices to monitor and evaluate the quality of a semiconductor junction after the formation of a silicide layer over said junction comprising:

(a) providing a silicon wafer having a region of a first conductivity type;

(b) forming a field oxide isolation on said wafer, said field oxide isolation having at least two openings and wherein a first opening of said at least two openings is rectangular with straight edges and a second opening of said at least two openings is rectangular with serpentine edges on at least one side;

(c) forming a rectangular polysilicon gate stack band over said field oxide isolation concentric with said first opening;

(d) forming sidewall spacers adjacent to said polysilicon gate stack band;

(e) implanting dopant impurity ions of a second conductivity type into said wafer, thereby forming semiconductor junctions in said at least two openings;

(f) depositing a silicon oxide layer on said wafer;

(g) patterning said silicon oxide layer to form oxide islands within said second opening and a rectangular band in said first opening whereby said rectangular band overlaps said straight edges such that a first area of silicon is exposed within said first opening, and a second area of silicon is exposed in said second opening;

(h) depositing a refractory metal layer over said wafer;

(i) depositing a protective layer on said refractory metal layer;

(j) annealing said wafer, thereby forming silicide pads within each of said openings;

(k) etching said wafer with an aqueous etchant whereupon said protective layer and residual unreacted refractory metal are removed and a first test device is formed in said first opening and a second test device is formed in said second opening;

(l) Forming a contact to said region of said first conductivity type;

(m) applying test probes to said contact and to said silicide pads;

(n) measuring leakage currents of said junctions; and (o) performing EMMI tests on said first and said second test devices with said junctions under reverse bias.

2. The method of claim 1 wherein said first opening and said second opening each have an area of between about 2,500 and 10,000 square microns.

3. The method of claim 1 wherein said silicon oxide layer is between about 200 and 1,000 Angstroms thick.

4. The method of claim 1 wherein said refractory metal layer is selected from the group consisting of titanium, cobalt and tungsten.

5. The method of claim 4 wherein said protective layer is TiN.

6. The method of claim 1 wherein said test devices are formed in the wafer kerf.

7. The method of claim 1 wherein a first plurality of first and second test device pairs having an n-first conductivity type and a second plurality of first and second test device pairs having a p-first conductivity type are formed on said wafer.

* * * * *